(12) United States Patent
Brennan et al.

(10) Patent No.: US 7,859,355 B2
(45) Date of Patent: Dec. 28, 2010

(54) REGULATED CAPACITIVE LOADING AND GAIN CONTROL OF A CRYSTAL OSCILLATOR DURING STARTUP AND STEADY STATE OPERATION

(75) Inventors: Aaron Brennan, Moscow, ID (US); Mike McMenamy, Tensed, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 134 days.

(21) Appl. No.: 11/277,185

(22) Filed: Mar. 22, 2006

(65) Prior Publication Data
US 2007/0030085 A1 Feb. 8, 2007

Related U.S. Application Data

(60) Provisional application No. 60/665,465, filed on Mar. 24, 2005.

(51) Int. Cl.
*H03L 5/02* (2006.01)
(52) U.S. Cl. .............. 331/183; 331/36 C; 331/177 V; 331/186
(58) Field of Classification Search ............. 331/158, 331/177 V, 186, 36 C, 183
See application file for complete search history.

(56) References Cited

U.S. PATENT DOCUMENTS

| | | | |
|---|---|---|---|
| 4,013,979 A | 3/1977 | Vittoz | |
| 4,788,466 A | 11/1988 | Paul et al. | |
| 5,534,826 A * | 7/1996 | Logan | 331/158 |
| 5,557,243 A | 9/1996 | Ho | |
| 5,621,396 A | 4/1997 | Flaxl et al. | |
| 5,774,006 A | 6/1998 | Barel et al. | |

(Continued)

FOREIGN PATENT DOCUMENTS

EP 0709965 5/1996

OTHER PUBLICATIONS

Chow et al., "High Performance Automatic Gain Control Circuit Using a S/H Peak-Detector for ASK Receiver," 9th International Conference on Electronics, Circuits and Systems, Sep. 2002, vol. 2, pp. 429-432.

(Continued)

*Primary Examiner*—Robert Pascal
*Assistant Examiner*—James E Goodley (57) ABSTRACT

An oscillator circuit and system are provided having a peak detector that can determine a peak voltage value from the oscillator. The peak voltage value can then be compared against a predetermined voltage value by a controller coupled to the peak detector. The comparison value is then used to change a bias signal if the peak voltage value is dissimilar from the predetermined voltage value. A variable capacitor or varactor can be formed from a transistor and is coupled to the oscillator for receiving the bias signal upon a varactor bias node. The bias signal is used to regulate the capacitance within the varactor as applied to the oscillator nodes. Another controller can also be coupled to the peak detector to produce a second bias signal if the peak voltage is dissimilar from a second predetermined voltage value. The second bias signal can then be forwarded into an amplifier having a variable gain to regulate the gain applied to the oscillator. The combination of a varactor and variable gain amplifier regulate the negative resistance applied to the resonating circuit during startup and steady state operations to ensure a relatively fast startup, and to maintain optimal loading and accurate steady state amplitude after startup has completed.

18 Claims, 3 Drawing Sheets

U.S. PATENT DOCUMENTS

| | | | |
|---|---|---|---|
| 5,999,062 | A | 12/1999 | Gilbert |
| 6,181,211 | B1 * | 1/2001 | Aho et al. .................... 331/11 |
| 6,696,898 | B1 | 2/2004 | Ward et al. |
| 6,759,914 | B2 | 7/2004 | Rusznyak |
| 6,798,301 | B1 | 9/2004 | Balan et al. |
| 7,009,460 | B2 * | 3/2006 | Wilcox ...................... 331/158 |
| 7,123,113 | B1 * | 10/2006 | Brennan et al. ............. 331/158 |
| 2002/0171500 | A1 | 11/2002 | Hasegawa et al. |

OTHER PUBLICATIONS

Koli et al., "Low voltage MOS-transistor-only precision current peak detector with signal independent discharge time constant," 1997 IEEE International Symposium on Circuit and Systems, Jun. 1997, vol. 3, pp. 1992-1995.

International Search Report, PCT/US2006/010533, mailed Jul. 7, 2006.

The Written Opinion of the International Searching Authority for International Application No. PCT/US2006/010533 mailed Jul. 24, 2006; 7 pages.

USPTO Notice of Allowance for U.S. Appl. No. 10/866,510 dated Jun. 16, 2006; 7 pages.

USPTO Non-Final Rejection for U.S. Appl. No. 10/866,510 dated Feb. 16, 2006; 10 pages.

USPTO Non-Final Rejection for U.S. Appl. No. 10/866,510 dated Sep. 26, 2005; 9 pages.

Bianchi et al., "Analog ALC Crystal Oscillators for High-Temperature Applications," IEEE Transactions on Solid-State Circuits, vol. 35, No. 1, Jan. 2000, pp. 2-14; 13 pages.

Vittoz et al., "High-Performance Crystal Oscillator Circuits: Theory and Application," IEEE Journal of Solid-State Circuits, vol. 23, No. 3, Jun. 1988, pp. 774-783; 10 pages.

Margarit et al., "A Low-Noise, Low Power VCO with Automatic Amplitude Control for Wireless Applications," IEEE Journal of Solid-State Circuits, vol. 34, No. 6, Jun. 1999, pp. 761-771; 11 pages.

\* cited by examiner

REGULATED CAPACITIVE LOADING AND GAIN CONTROL OF A CRYSTAL OSCILLATOR DURING STARTUP AND STEADY STATE OPERATION

PRIORITY CLAIM

This application claims priority to U.S. Provisional Application No. 60/665,465 entitled "Crystal Oscillator Capacitor Override," filed Mar. 24, 2005.

BACKGROUND OF THE INVENTION

1. Field of the Invention

The present invention relates to an oscillator and, more specifically, to a crystal oscillator circuit having a regulated capacitive loading and regulated amplifier gain to optimize both startup and steady state operation of the crystal oscillator.

2. Description of the Related Art

The following descriptions and examples are not admitted to be prior art or conventional by virtue of their inclusion within this section.

Within nearly every electronic subsystem is some form of generator that produces cyclical waveforms. The waveform generator is oftentimes referred to as an oscillator. Depending on the application, an oscillator can be used simply as a source of regularly spaced pulses or clock signals. There are numerous types of oscillators available in the marketplace, ranging from simple RC relaxation oscillators to more complex LC oscillators, and also the more stable crystal oscillators. Crystal oscillators use a piezoelectric material such as quartz, where acoustic waves in the crystal are driven by an applied electric field and, in turn, can generate a voltage at the surface of the crystal. The potential across the resonant network is constrained to vary in time according to the electromechanical characteristics of the quartz crystal lattice. This selectivity in frequency can be electrically modeled by a combination of inductance, capacitance, and resistance which correlate to the characteristics of a given quartz crystal. The size and shape of the quartz crystal is fashioned to produce a specific set of these characteristics which determine the periodicity of sinusoidal variation of electrical potential across the resonant network. The quartz thereby operates as a resonator that is pre-tuned to a specific resonant frequency.

In order to initiate and maintain strain on the crystal, crystal oscillators generally include an amplifier coupled across nodes of the crystal. While the least impedance value across the crystal occurs at its resonant frequency, an amplifier that drives the crystal may pull the frequency of the crystal depending on certain performance traits of that amplifier. Moreover, the oscillator can possibly employ tuning capacitors placed on the nodes of the oscillator. The tuning capacitors may also pull the frequency of the crystal. Therefore, a resonating piezoelectric material is formed by electrical circuitry in combination with the frequency selective quartz electromechanical system, which initiates the resonating frequency and maintains that frequency at a pre-defined amplitude.

The capacitors placed on nodes of the oscillator are oftentimes referred to as $C_{Xin}$ and $C_{Xout}$. When combined, $C_{Xin}$ and $C_{Xout}$ place a capacitive load of $C_L = (C_{Xin} \times C_{Xout})/(C_{Xin} + C_{Xout})$. As $C_{Xin}$ and $C_{Xout}$ increase, the loading capacitance $C_L$ will also increase thereby increasing impedance on the crystal oscillator. In addition to the capacitive loading, the crystal resonator also has a motional resistance inherent in the material used to form the crystal. The motional resistance of a crystal depends on the amount of power or drive level (DL) dissipated by the crystal. The crystal's motional resistance is larger under startup conditions when the DL is small compared to the motional resistance presented by the crystal to the amplifier under steady-state conditions. This dependency of crystal motional resistance on DL is commonly termed drive level dependency (DLD). A larger negative resistance from the amplifier is required to offset the larger crystal motional resistance at startup due to DLD, and to therefore initiate crystal oscillation.

An amplifier is typically used to overcome DLD of the motional resistance within the crystal and to offset the capacitive loading and resulting impedance on the oscillator nodes. The amplifier provides what is known as "negative resistance" to offset the real part of the impedance looking into the circuit from the crystal, the real part of the impedance comprising the amplifier, feedback resistor, and load capacitors. The real part of the impedance is oftentimes referred to as the effective resistance, or Re, and is represented as $Re = -(gm C_{Xin} C_{Xout})/((gm C_0)^2 + \omega^2 (C_{Xin} C_{Xout} + C_{Xout} C_0 + C_0 C_{Xin})^2)$ which is calculated from a linear analysis of the oscillator circuit, where $g_m$ is the transconductance (or gain) of the amplifier, $C_0$ is the shunt capacitance of the crystal, and $\omega$ is the frequency of the oscillation. At startup, the negative resistance from the amplifier needs to be larger than the motional resistance of the crystal As shown above, the real part of the impedance or resistance of the circuit not only changes with frequency, but also changes based on the load capacitances at the Xin and Xout nodes. For example, at startup of the oscillator when the frequency and amplitude have not reached their steady state, the resistance of the circuit is at its maximum. Moreover, when the load capacitors are large, the resistance of the circuit is also large. As defined herein, "startup" is a condition in which the amplitude output from the oscillator has not reached its targeted value, and the frequency output from the oscillator has also not reached its targeted value. Once the amplitude and frequency have achieved their targets, then the oscillator is said to be performing in a steady state mode of operation.

It would be desirable to introduce an oscillator that can change the amount of negative resistance seen by the resonating crystal depending on whether the oscillator is in startup mode or steady state mode. Therefore, the desired oscillator would represent an improvement over conventional oscillators if such an oscillator can regulate the capacitive loading and the amplifier gain across the oscillator frequency bandwidth, as well as during the startup and steady state operations of that oscillator.

SUMMARY OF THE INVENTION

The problems outlined above are in large part solved by an improved oscillator circuit that preferably includes a piezoelectric material such as a quartz crystal. The improved oscillator includes circuitry which monitors the oscillator output. Depending on, for example, the amplitude of that output relative to a reference, the oscillator includes further circuitry that can change the capacitive loading and/or amplifier gain as seen by the oscillator. For example, during a startup mode, it would be desirable to reduce the capacitive loading seen by the crystal and to increase the amount of negative resistance provided by the circuit. This can provide faster startup conditions and, as the oscillator output approaches steady state, the circuitry can monitor that output and increase the capacitive loading, preferably, before the circuitry reduces the amplifier gain. Eventually, however, the oscillator achieves steady state and the monitored output will match the reference signals and voltage values, whereby capacitive loading need not be further changed nor will gain of the amplifier be changed in order to maintain the steady state amplitude and frequency as long as the system remains unperturbed, and the circuit will correct any perturbations injected into the system, maintaining constant amplitude.

According to one embodiment, an oscillator is provided that includes a peak detector coupled to determine a peak voltage value from the oscillator. A controller may be coupled to the peak detector. The controller compares the peak voltage value against a predetermined voltage value, and changes a bias signal if the peak voltage value is dissimilar in absolute magnitude than the predetermined voltage value. A variable capacitor (or varactor) is preferably coupled to the oscillator. The varactor includes a bias node upon which the bias signal is forwarded to regulate a capacitance applied to the oscillator.

If the gain of an amplifier is also to be regulated or controlled, a second controller may be needed. The second controller may be coupled to the peak detector for comparing the peak voltage value against a second predetermined voltage value, and the second controller changes a second bias signal if the peak voltage value is dissimilar in absolute magnitude than the second predetermined voltage value. An amplifier coupled to the oscillator includes an amplifier bias current control node upon which the second bias signal is forwarded to regulate a gain applied to the oscillator.

According to another embodiment, the oscillator includes a pair of nodes. A piezoelectric material can be coupled between the pair of nodes. An amplifier can also be coupled between the pair of nodes for producing a sinusoidal signal upon the pair of nodes due to the high quality factor of the piezoelectric material connected in a feedback loop with the amplifier during initial startup operation of the oscillator, and during subsequent steady state operation of the oscillator. A peak detector is coupled to at least one node of the pair of nodes for determining a peak voltage value of the sinusoidal signal. A controller can receive the peak voltage value, and compare that value against a predetermined voltage value to apply a first capacitive load to the pair of nodes during initial startup if the peak voltage value is less than the predetermined voltage value. The controller can apply a second capacitive load to the pair of nodes greater than the first capacitive load during steady state if the peak voltage value is equal to or greater than the predetermined voltage value.

According to yet another embodiment, a method is provided for monitoring the output of an oscillator. That output is then compared against a predetermined value. If the monitored output is different from the predetermined value, then a feedback is provided to modify the output so that it substantially matches the predetermined value. By changing the capacitive loading and the gain of the oscillator, a relatively fast startup can occur so that the oscillator quickly progresses to steady state with maximum negative resistance seen by the resonating circuit. Thereafter, once the oscillator output arrives at or exceeds the predetermined value, the capacitive loading is reduced first, before gain is reduced.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Figure 1:
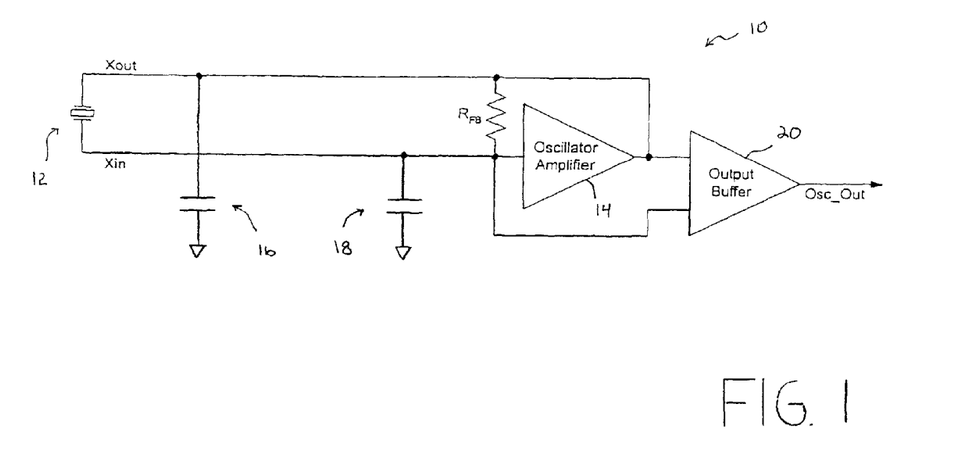
FIG. 1 is a circuit diagram of an amplifier and a feedback resistor coupled across a crystal to initiate and maintain oscillation at the resonant frequency of the crystal that may be tuned by load capacitors.

Turning now to the drawings, FIG. 1 illustrates one form of an oscillator 10 having a piezoelectric resonator 12. Oscillator 10 may include either an inverter or, as shown, an amplifier 14 placed between nodes of the resonator 12. A feedback resistor $R_{FB}$ can also be connected between oscillator nodes to bias the nodes to an appropriate voltage differential. The frequency of oscillation can be varied if needed by adjusting capacitance values within capacitors 16 and 18 coupled, respectively, to nodes Xout and Xin. The capacitors can be modified in value to possibly pull the frequency of the oscillator. Rather than having to change out the capacitors each time the oscillator frequency must be changed, capacitors 16 and 18 are preferably voltage-variable capacitors or varactors. Varactors used in this way also allow the oscillation frequency to be controlled by the varactor control voltage to from a voltage controlled crystal oscillator (VCXO). There are many ways in which a varactor can be formed. For example, a diode junction, oftentimes referred to as the pn junction, can form a capacitance that decreases with increased reverse voltage. This form of varactor can be referred to as a diode varactor in which the junction capacitance of the diode depends on the applied voltage and the overall design of that junction. There may be another form of varactor that produces a variable capacitance as will be further described in reference to FIG. 3.

In addition to amplifier 14, capacitors 16 and 18, and feedback resistor $R_{FB}$, the differential output across amplifier 14 can be buffered if needed. An output buffer 20 can be formed as a differential amplifier to produce a single-ended output (Osc_Out). The single-ended output can be used as a clocking signal to an electronic system, for example. Also, the output from buffer 20 can be selectively enabled or disabled depending on the amplitude reached by amplifier 14. For example, if the amplitude is less than a particular set point, then possibly an output enable signal can be sent to buffer 20 to signify that the output from buffer 20 should be disabled. It is only when amplifier 14 output achieves a value above the set point will the buffer 20 be enabled. While is preferred that buffer 20 be disabled until the amplifier output achieves a certain value, it is also possible to realize an oscillator without an enable/disable output.

While oscillator 10 achieves suitable, fairly accurate output frequency at steady state, the loading capacitance value on the resonator nodes and the somewhat fixed gain of amplifier 14 proves unsuitable for achieving rather fast startup progression to steady state operation. Not only must capacitors 16 and 18 be variable, but the amount by which those values vary should be controlled based on the oscillator output. Moreover, the gain of amplifier 14 must also be variable and based on the oscillator output.

Figure 2:
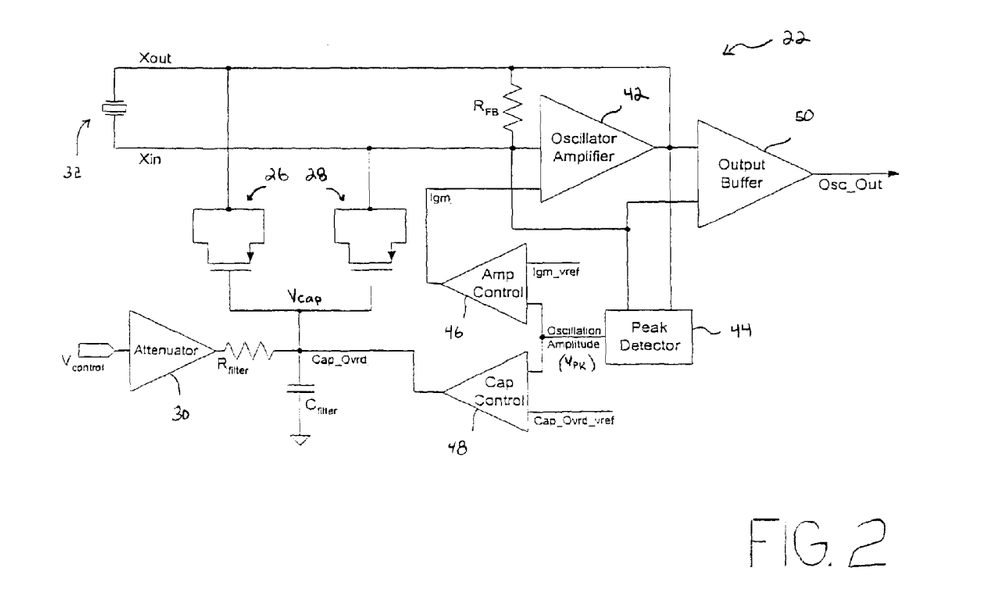
FIG. 2 is a circuit diagram of load capacitors having capacitive values regulated by a capacitor control circuit, and an amplifier gain regulated by a amplifier gain circuit, both of which compare a peak voltage value of the oscillator output with respective reference voltages to control the capacitive loading and gain of the oscillator during startup and steady state operations.

Oscillator 22 shown in FIG. 2 represents a substantial improvement over oscillator 10. Oscillator 22 includes a pair of varactors 26 and 28 coupled to the Xout and Xin nodes, respectively. Varactors 26 and 28 can be made from a metal oxide semiconductor (MOS) transistor and preferably from a p-channel MOS transistor. A control voltage $V_{CONTROL}$ can be placed into an attenuator 30 which attenuates the input control voltage to an optimal DC value. Whatever AC components exist on the DC voltage value can then be filtered by a low-pass filter comprising $R_{filter}$ and $C_{filter}$ to provide a capacitor control voltage or Vcap.

The load capacitance $C_L$ provided by circuit 22 upon crystal resonator 32 is at its maximum value when Vcap is at its minimum value. Conversely, load capacitance $C_L$ provided by circuit 22 is at its minimum value when Vcap is at its maximum value. The amount of attenuation applied to the control voltage $V_{control}$ will determine a variable range of load capacitance that the resonating crystal 30 will see as its load.

Figure 3:
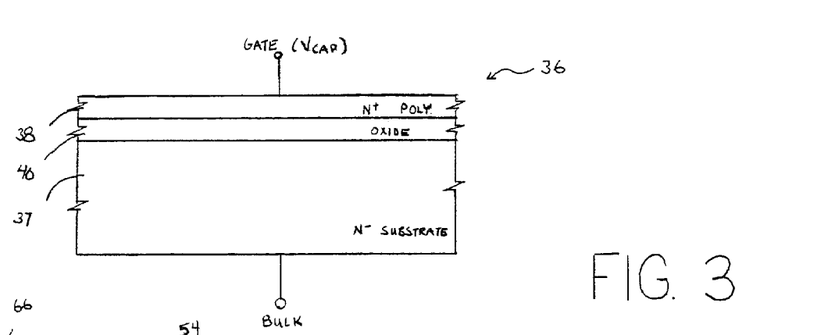
FIG. 3 is a partial, cross-sectional view of a variable capacitor, or varactor, of FIG. 2 operating between the depletion and inversion modes.

In order to understand the capacitance of varactors 26 and 28, FIG. 3 is provided. The varactor bias node upon which $V_{CAP}$ is applied is between the gate node and the bulk node of the MOS transistor. Transistor 36 is shown as a PMOS transistor, with both drain and source regions doped with p-type elements into an n-type substrate 37, or well. In addition, the source and drain of the PMOS transistor are connected together electrically and form one node of the capacitor. Placed between a polysilicon gate conductor 38 and substrate 37 is a dielectric 40, which is preferably an oxide. The threshold voltage of the PMOS transistor is Vthp and is expressed as a negative number. For Vthp≦Vcap≦0 Volts relative to the bulk potential, the varactor operates in the depletion mode. As the Vcap control voltage between the gate node and the bulk node of the transistor becomes more negative, a negative charge is induced on the gate. This negative charge pushes away the negative carriers at the oxide/semiconductor interface creating a region depleted of charge carries exposing fixed positively charged ions. The depleted space charge region behaves like a capacitor ($C_D$) that has a capacitance that is smaller than the capacitance due to the oxide ($C_{ox}$). The total capacitance in the depletion mode of operation is $C_D$ in series with $C_{ox}$. The varactor capacitance is thus at its minimum value when the gate voltage is equal to the bulk voltage which is connected to the positive supply voltage.

For Vcap≦Vthp volts, varactor operates in the inversion mode because increased charge on the gate attracts positive charge carriers (holes) to the oxide semiconductor interface. Thus, the silicon under the gate has been inverted from n-type to p-type. This inversion layer acts as a plate directly under the oxide that is connected to the source/drain nodes. The maximum capacitance is achieved when the gate voltage is equal to the negative supply voltage. Moreover, as Vcap increases in magnitude, the amount of capacitance within varactors 26 and 28 also increases to increase the capacitive loading on the oscillator nodes. An oscillator circuit with large loading capacitance values may not produce sufficiently high negative resistance to the resonant network during startup operation. During startup it is desirable to have a high negative resistance with the capacitive loading minimized and the amplifier gain maximized. Since the startup negative resistance supplied to the resonator is inversely proportional to the load capacitance presented to the circuit by the Xin and Xout varactors 26 and 28, it is desirable to have minimum load capacitances and, therefore, maximum negative resistance for a robust oscillator startup characteristic. This is achieved by not only controlling the attenuator 30 output, but also by placing a capacitor override (Cap_Ovrd) signal into the Vcap varactor bias node, as shown in FIG. 2.

FIG. 2 illustrates the improved oscillator 22 having reduced capacitive loading during startup. This reduction in capacitive loading during startup results in the circuit 22 presenting a higher available negative resistance to the resonant network or resonator crystal 32. The negative resistance of the oscillator must be larger than the resistive losses in the resonator 32 in order to create the instability in the system that leads to a growing oscillation waveform. As the oscillation amplitude grows to a steady state value, the negative resistance gradually decreases until the negative resistance generated by the oscillator circuitry exactly cancels the positive resistance inherent in the resonator.

There are several reasons that higher negative resistance is desirable. Firstly, the oscillator startup time is defined as the time required for the oscillator to reach steady state oscillations once the oscillator 22 is turned on or enabled. The steady state oscillations are those in which the oscillator produces an amplitude which remains fairly constant in absolute value, and in which the frequency also remains fairly constant. The oscillator startup time is inversely proportional to the difference between the negative resistance supplied by the amplifier 42 and the positive resistance contained within the resonator 32. If the negative resistance is increased due to higher gain from amplifier 42, and lower capacitive loading associated with capacitors 26 and 28 relative to the positive resistance of resonator 32, then the startup time will be considerably shortened.

Secondly, drive level dependency (DLD) creates a need for higher negative resistance. The resistance of the crystal is a non-linear function of the DL applied to the crystal by amplifier 42 or generally the power applied to the crystal is used to overcome the motional resistance of the crystal. For DL's less than 10 μW many crystals exhibit a motional resistance that is significantly larger than the motional resistance observed from 10 μW<DL<100 μW.

Thirdly, reducing the load capacitance is also needed at startup since this will lessen the amount of transconductance or gain (gm) that the amplifier must provide. The gain required for steady state operation is usually significantly less than the gain required to meet startup negative resistance requirements. Reducing the amount of gain required at the maximum load capacitance reduces the amount of area and the current consumption of the oscillator amplifier. There may also be other reasons for having higher negative resistance and for reducing the load capacitance on the Xin and Xout nodes. However, for brevity, not all reasons are described herein.

Oscillator 22 ensures a higher negative resistance during startup than at steady state, and comprises a peak detector 44, an amplifier controller 46, and a capacitor controller 48. Although an output buffer 50 may be used, the output buffer need not be required for purposes of monitoring the oscillator output, detecting a peak value, and comparing that value to a reference value in order to control the capacitance and gain within the oscillator. Those functions are reserved for peak detector 44, capacitor controller 48, and amplifier controller 46. By placing the comparison result onto the Vcap node, the capacitances of varactors 26 and 28 can be controlled and, accordingly, the capacitive loading can be controlled. By placing the comparison output from the amplifier controller 46 into amplifier 42, the difference between the peak value and the reference value is proportional to the Igm signal that is used to vary the amplifier 42 gain.

Peak detector 42 can measure the amplitude of either one or both oscillator nodes with respect to one another, or either potential or both with respect to power, ground, or some other reference potential, and provides the peak value $V_{PK}$ to the controller blocks 46 and 48. Controllers 46 and 48 sense the differences between the peak value and a reference value and, based upon the difference, creates a control signal. For the amplifier, the difference between the reference voltage Igm_vref and the detected peak value will then be used to determine the amplifier bias current Igm. When the peak value is less than Igm_vref voltage, controller 46 differential amplifier supplies the maximum amplifier bias current Igm, resulting in maximum amplifier transconductance or gain. When the detected amplitude is equal to the Igm_vref voltage, controller 46 differential amplifier supplies the nominal amplifier bias current that results in a nominal amplifier gain precisely compensating for losses in the electromechanical system and producing steady state oscillations. As the oscillation amplitude becomes larger than the Igm_vref voltage, the bias current supplied by controller 46 differential amplifier will continue to decrease until the amplifier bias current resulting in the desired steady state amplitude is reached.

For varactors 26 and 28, the difference between the reference voltage Cap_Ovrd_vref and the detected peak value determines the amount of current injected by controller 48 differential amplifier into the Vcap control node. When the detected amplitude is less than the Cap_Ovrd_vref voltage, controller 48 injects a current proportional to the difference between the varactor control voltage and the power supply potential to the Vcap node. This pulls the Vcap voltage toward the power supply voltage and minimizes capacitance during startup operation of the oscillator 22.

Figure 5:
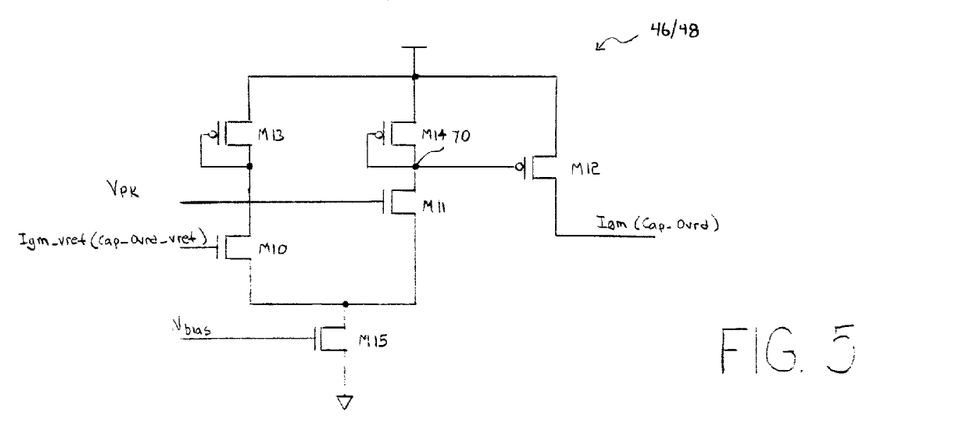
FIG. 5 is a circuit diagram of the amplifier (or capacitor) control circuit of FIG. 2.
Figure 6:
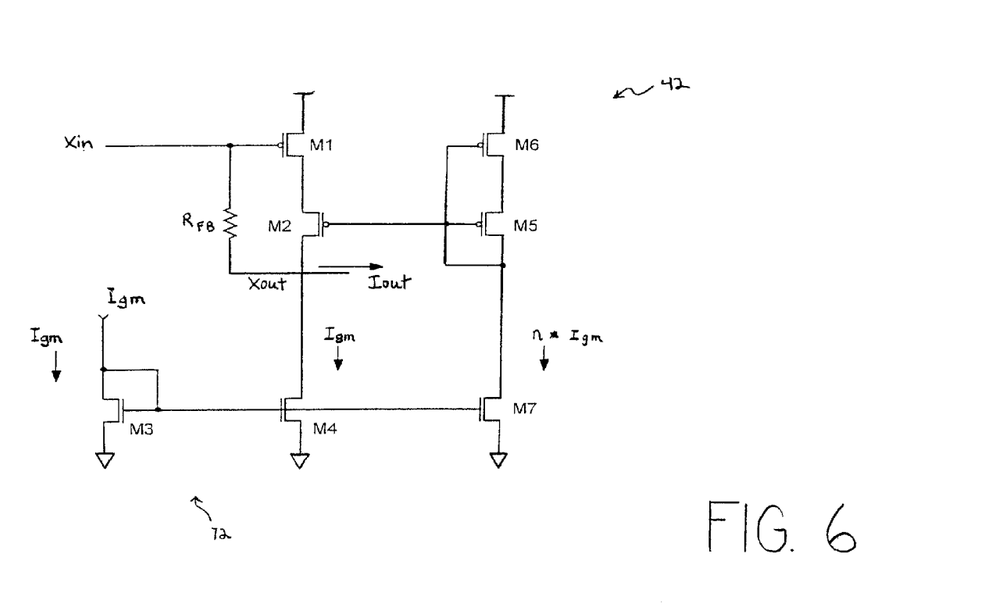
FIG. 6 is a circuit diagram of the amplifier of FIG. 2, whose gain is controllable with a gain control signal sent from the amplifier control circuit.

Under startup conditions, the output from amplifier 42 starts at a magnitude at or substantially near 0 volts. Thus, at startup, the Vcap voltage is at the positive power supply potential resulting in the minimum load capacitance. Oscillation amplitude of 0 also results in the maximum oscillator amplifier gain. The combination of minimum load capacitance and maximum gain will result in maximum negative resistance for an oscillator properly designed to work with resonator 32. Making the actuation and release of the varactor override (i.e., Cap_Ovrd) signal proportional to the oscillation magnitude results in the slowest time constant available in a crystal oscillator system governing this function, minimizing risk of instability. Further details of peak detector 44 are shown in FIG. 4, details of controller 46 (or 48) are shown in FIG. 5, and details of amplifier 42 are shown in FIG. 6.

Figure 4:
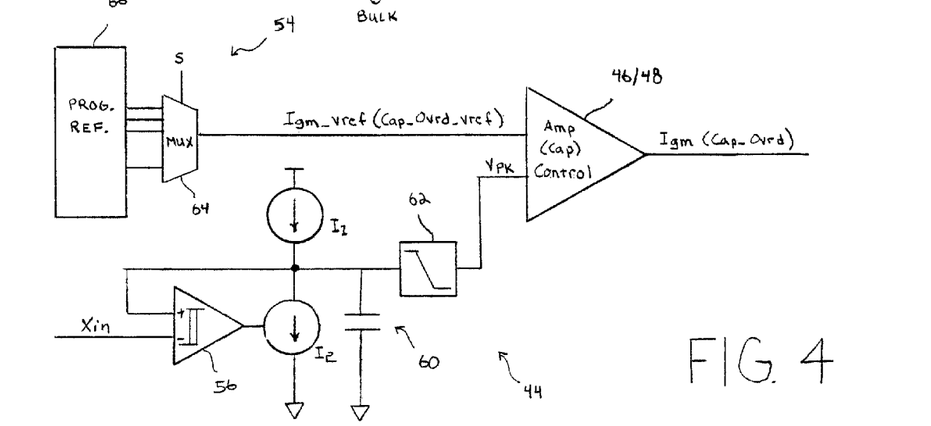
FIG. 4 is a circuit diagram of the peak detector and amplifier (or capacitor) control circuits of FIG. 2, with the reference voltages possibly selectable from a programmable reference circuit.

Referring to FIG. 4, a peak detector 44 is shown along with setpoint circuitry 54 used in setting one or more of the reference voltages. Peak detector circuit 44 generally includes a comparator 56 that compares the voltage on one of the nodes (i.e., Xout) with a stored peak voltage value. A hold capacitor 60 is used to store the peak voltage value. Depending on the comparison of the stored peak voltage value with Xout, comparator 56 controls a current source $I_2$. Current source $I_1$ supplies a smaller current than $I_2$, and is always on. If $I_2$ does not turn on, the voltage on the hold capacitor 60 will increase. If the instantaneous voltage at Xout is below the hold capacitor voltage, comparator 56 will turn on current source $I_2$. Since $I_2$ can sink more current than $I_1$ can source, when $I_2$ is turned on, the voltage on the hold capacitor 60 will decrease. Once the voltage on the hold capacitor matches the voltage at Xout, the comparator 56 will turn off the current source $I_2$.

Current source $I_2$ is large enough to allow the current to track the valleys or negative peaks of Xout waveform. Once the floor of Xout waveform is reached, circuit 44 will hold the detected peak with a slight increase towards the positive supply voltage, due to current source $I_1$ adding charge. If the current sources $I_1$ and $I_2$ are sized appropriately for the hold capacitor 60 and the frequency of operation, the voltage across the hold capacitor 60 is the detected peak of the Xout waveform. Thus, the voltage on the hold capacitor 60 can be used to measure the amplitude of Xout. Another comparator input connected to Xin can be added to measure the maximum amplitude of either Xin or Xout (peak value will be the largest amplitude).

Once the amplitude is known, it is passed through a low-pass filter 62 and subtracted from the desired amplitude setpoint that is selected from multiplexer 64. Programmable reference 66 is illustrated as a band-gap reference or simply a resistor string with multiple taps. Thus, programmable reference circuit 66 can be realized using a band-gap reference circuit and band-gap reference circuitry is generally well-known in the art. The reference voltages produced from circuit 66 can be offset from each other by a fixed amount if desired, and the selection signal S can be used to select a particular setpoint or reference voltage value. As shown, the presence or absence of a logic value on the select input can establish the selection of either Igm_vref or Cap_Ovrd_Vref. Depending on which reference signal is set to multiplexer 64, the values of Igm_vref and Cap_Ovrd_Vref can be easily modified.

Regardless of what the value is of the selected referenced signal, the reference value is compared to the peak value from peak detector 44, and the difference can be amplified to produce a bias current Igm to be supplied to the amplifier, or a capacitor override current Cap_Ovrd to be supplied to the Vcap node via controller 46 or 48, depending on which reference signal is compared and which bias signal is sent.

FIG. 5 shows further details of controllers 46 (or 48). Each controller 46 (or 48) is configured the same, the only difference being the reference signal forwarded to that controller, and the bias signal output from the controller. For sake of brevity, the controller of FIG. 5 will be described in connection with the capacitor override reference voltage Cap_Ovrd_Vref signal, thereby producing the capacitor override Cap_Ovrd current. If the peak voltage ($V_{PK}$) is less than the capacitor reference voltage, which would normally be the case during startup, then transistor M10 is activated while transistor M11 is deactivated. The controller 46 (or 48) may optionally include hysteresis to provide immunity to the noise on the peak voltage ($V_{PK}$). This ensures that node 70 is pulled toward the power supply rail and, correspondingly, transistor M12 is turned off. This reduces to substantially 0 the capacitor override bias current placed into the Vcap node of FIG. 2. With less bias current, the Vcap voltage is dominated by the voltage set by attenuator 30 in FIG. 2. Thus, the capacitance value is determined by the Vcontrol signal shown in FIG. 2 and is not overridden by Cap Control 48. However, if the peak voltage exceeds the capacitor override reference voltage, then transistor M11 is activated while transistor M10 is deactivated. This will cause node 70 to be pulled towards the ground supply to turn on transistor M12 and forward a much larger bias current from the controller 48. This will result in a smaller Vcap voltage because the voltage difference between the gate node and the bulk node of varactors 26 and 28 will be minimized, placing the varactors in a depletion mode to increase the load capacitance upon the oscillator.

The example illustrating a capacitor controller 48 is equally applicable to an amplifier controller 46. In other words, the comparison between the peak voltage and the reference voltage will produce a bias current Igm at the output, whose magnitude is dependent on the difference between the incoming peak voltage and reference voltage. For example, if the magnitude of the peak voltage is less than the magnitude of the reference voltage, then the bias current will be larger than if the peak voltage is greater than the reference voltage. The bias current Igm is then forwarded to amplifier 42 (FIGS. 2, 6).

FIG. 6 illustrates one example of an amplifier 42. Transistors M3, M4, and M7 are coupled to form a current mirror. An external control loop 72 applies the control current Igm to transistor M3 arising from the output of controller 46 (FIGS. 2, 5). Transistors M4 and M7 are sized so that Igm will flow through M4 and n*Igm will flow through transistor M7. Since transistor M4 is attached to the amplifier output node Xout, the maximum amount of current the amplifier can sink is Igm.

The maximum current that transistor M1 can source to the output node is determined by the voltage at the amplifier input node Xin. If the voltage at Xin is close enough to the positive supply voltage, transistor M1 will only supply a very small leakage current to Xout, and the amplifier will sink a current of Igm from Xout to ground through transistor M4. On the other hand, if Xin is close to a negative supply of voltage, transistor M1 will be able to supply current much larger than the bias current Igm to Xout. Under this condition, the current that can be sourced through transistors M1 and M2 will be determined by the gate voltage on transistor M2. Thus, at the oscillation amplitude peak, the current that amplifier 42 will sink is the current through transistor M4 since the current through transistors M1 and M2 is orders of magnitude smaller. At oscillation amplitude valleys, the current the amplifier 42 will source is the current through transistor M2 minus the current through transistor M4.

As shown, the external amplitude control loop 70 is used to adjust the current flowing into transistor M2 and, thus, control the transconductance of transistor M2 which is also controlled by a diode-connected transistor control loop consisting of transistor M5 in conjunction with transistors M6 and M7. This biasing current Igm from controller 46 thereby controls the bias current Igm through transistor M4. The amount of current sourced from the Xout node will preferably be substantially equal to the amount of current sunk into that node, thereby ensuring amplifier 42 is symmetrical. Preferably, at steady state, amplifier 42 must sink as much current as it sources. This ensures that transistors M1 and M2 will be on just long enough to balance the current that flows into and out of the oscillator nodes.

Amplifier 42 illustrates a composite common source/common gate amplifier configuration made up of transistors M1 and M2. The bias at the gate of transistor M2 controls the amount of current that can flow between the source and drain of transistor M2. Transistor M2 thereby acts as a current limit device, where the maximum current is controlled by the bias network consisting essentially of transistors M7, M5, and M6. If the current flowing through transistor M5 limits the current through transistor M2 to an integer n multiplied by the bias current Igm, the maximum current that amplifier 42 can source will be the current through both M1 and M2 minus the current through M4.

The current limit transistor M2 and the bias network of transistors M5-7 are sized within appropriate width and length ratios to force the required amount of symmetry between the positive and negative half-cycles of the output. The output current Iout can have a rounded negative half-cycle, without any substantial current peaks during that half-cycle. The output current is preferably symmetrical about 0 amps. The output voltage is symmetrical about the average value of the oscillation output, which is determined by the value of Igm through the amplifier 42. Since the output voltage and current are sinusoidal, output harmonics are minimized.

Figure 7:
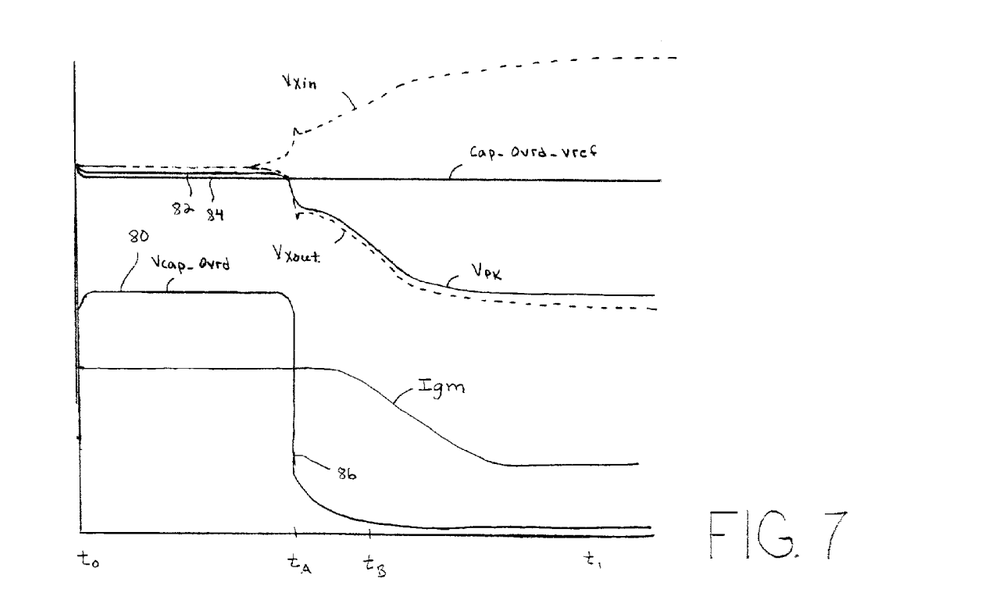
FIG. 7 is a graph of various signals used to control the crystal oscillator of FIG. 2 during startup and steady state operations.

Referring to FIGS. 2 and 7 in combination, various waveforms at certain nodes of FIG. 2 are shown in FIG. 7. For example, at startup between $t_0$ and $t_1$, controller 48 places the maximum current within the bias signal upon Cap_Ovrd node. This causes the Vcap_Ovrd to be at a maximum voltage value 80. The resulting small Vcap (Vcap=Vg−Vb) voltage will cause the varactors 26 and 28 to enter depletion mode, thereby reducing the load capacitance as seen by resonator 32. The reason that Vcap_Ovrd is at a maximum voltage value is because the peak voltage value $V_{PK}$ 82 is less in absolute magnitude than the reference value Cap_Ovrd_vref 84. It is not until time $t_A$ that $V_{PK}$ increases beyond the capacitor override reference voltage (i.e., becomes less than, but greater in absolute magnitude). Once this happens, controller 48 turns off the capacitor override current as the absolute magnitude increases, thereby reducing the voltage 86 at the Vcap node. It is not until after the controller 48 releases control of the Vcap voltage to attenuator 30 that the amplifier controller 46 starts to reduce the amplifier bias current at its current and, therefore, reducing the amplifier gm. As shown, controller 46 does not begin reducing the amplifier bias current until time $t_B$ which is after controller 48 decreases its output bias current at time $t_A$. As the voltage at the gates of M2, M5 naed M6 increases toward the power supply voltage, the bias current Igm in the amplifier circuitry decreases, and vice-versa.

By reducing the amplifier bias current after the capacitor override current is reduced, the circuit ensures that only the voltage at the $V_{control}$ node determines the oscillator load capacitance. If the amplifier bias current is allowed to decrease in response to increasing the amplitude before the capacitor controller 48 has completely released the override of the Vcap voltage, oscillator 22 will potentially result in a negative resistance that matches the crystal resonator losses with a non-0 current from controller 48. As a result, controller 48 is designed to release control of the load capacitance before the amplifier gm is decreased to achieve steady state oscillation. By releasing control of the load capacitance, the varactors are ensured to be placed at their "tuned" capacitance level and, therefore, the oscillator is ensured of operating at its designed frequency.

As shown in FIG. 7, the oscillation amplitude on the nodes Xin and Xout are illustrated in dashed line $V_{Xin}$ and $V_{Xout}$, from startup to steady state oscillation. The peak detector will detect the valleys of the oscillation waveforms to be lower than the initial detected amplitude, as shown by the difference between $V_{PK}$ and $V_{Xout}$ waveform. At time between $t_0$ and $t_A$, the oscillator amplitude is relatively small and almost too small to be detected. The Vcap voltage is very close to the 3.3 volt supply voltage of the circuit yielding minimal load capacitance, and the Igm_control current is at its maximum value which corresponds to maximum amplifier bias current and gm. Between times $t_A$ and $t_B$, controller 48 transitions from override of the Vcap voltage to no override of the Vcap voltage. From approximately time $t_A$ and forward, the load capacitance is determined by the external $V_{control}$ voltage. Between times $t_B$ and $t_1$, the amplitude control gradually decreases the amplifier gm so that steady state oscillations are reached at approximately time $t_1$. The waveform diagram of FIG. 7 shows there is minimal overlap between the Cap control and the Amp control functions in order to achieve proper operation. In this example, the external $V_{control}$ is set close to the minimal value showing the circuit is stable because the Cap control function tracks the oscillation growth envelope which is usually the slowest time constant in the oscillator system.

In an alternative embodiment of the improved circuit, the input of the varactor override may be derived from a rectifier and filter voltage from the crystal oscillation, or by any voltage proportional to crystal magnitude. The advantages of the improved oscillator system include that it reduces capacitive loading during startup operation resulting in the highest possible negative resistance at startup. Higher negative resistance results in lower startup time and significantly reduced sensitivity to the DLD effect of lower quality crystal resonators. Reduction in current consumption and area are possible if the gm requirements of the amplifier at the maximum load capacitance are reduced.

The various circuit features set forth in the present disclosure are not to be interpreted as reflecting all possible features of the claimed invention. The specification and drawings are, therefore, to be regarded in an illustrative rather than a restrictive sense.

What is claimed is:

1. A system, comprising:
    an oscillator;
    a peak detector coupled to determine a peak voltage value from the oscillator;
    a controller coupled to the peak detector for comparing the peak voltage value against a predetermined voltage value;
    a varactor coupled to the oscillator, wherein the controller is configured to change a bias signal applied to a bias node of the varactor to regulate a capacitance applied to the oscillator when the peak detector indicates that the peak voltage value is dissimilar in absolute magnitude than the predetermined voltage value, and wherein the controller is further configured to regulate the capacitance across a range of load capacitances using the bias signal;
    a second controller coupled to the peak detector for comparing the peak voltage value against a second predetermined voltage value, and to change a second bias signal if the peak voltage is dissimilar in absolute magnitude than the second predetermined value; and
    an amplifier coupled to the oscillator and having an amplifier bias node upon which the second bias signal is forwarded to regulate a gain applied to the oscillator.

2. The system as recited in claim 1, wherein the varactor comprises a metal oxide semiconductor transistor having a source and drain region coupled together.

3. The system as recited in claim 1, further comprising:
    an input node;
    an attenuator coupled to the input node; and a low-pass filter coupled between the attenuator and the bias node.

4. The system as recited in claim 3, wherein the input node is adapted to receive a control voltage that, when forwarded through the attenuator and the low-pass filter, provides a capacitor control voltage to the varactor bias node.

5. The system as recited in claim 1, wherein the peak detector comprises:
    a holding capacitor coupled to store the peak voltage value;
    a comparator adapted to compare the stored peak voltage against a sinusoidal signal; and
    a current source coupled to and controlled by an output of the comparator for changing voltage on the holding capacitor if the sinusoidal signal is dissimilar in amplitude than the peak voltage value.

6. The system as recited in claim 1, wherein the controller and the second controller each comprises:
    a differential amplifier adapted to amplify a difference between the peak voltage value and the predetermined voltage value.

7. The system as recited in claim 6, wherein the controller further comprises a transistor coupled to an output of the differential amplifier to forward a first amount of current in the bias signal if the peak voltage value is less than the predetermined voltage value, and to forward a second amount of current greater than the first amount of current in the bias signal if the peak voltage value is greater than the predetermined voltage value.

8. The system as recited in claim 7, wherein the first amount of current applied to the varactor decreases the capacitance of the varactor relative to the second amount of current applied to the varactor.

9. The system as recited in claim 7, wherein the first amount of current is applied during start up operation of the oscillator and the second amount of current is applied after start up operation of the oscillator.

10. The system as recited in claim 7, wherein a third amount of current between the first and second amounts of current is forwarded when the peak voltage value is equal to the predetermined voltage value.

11. The system as recited in claim 10, wherein the third amount of current is applied during steady state operation of the oscillator.

12. An oscillator, comprising:
    a pair of nodes;
    a piezoelectric material coupled between the pair of nodes;
    an amplifier coupled between the pair of nodes for producing a sinusoidal signal upon the pair of nodes during initial startup operation of the oscillator and during subsequent steady state operation of the oscillator;
    a peak detector coupled to at least one node of the pair of nodes for determining a peak voltage value of the sinusoidal signal;
    a controller coupled to compare the peak voltage value with a predetermined voltage value and to apply a first capacitive load to the pair of nodes during initial startup if the peak voltage value is less than the predetermined voltage value and to apply a second capacitive load to the pair of nodes greater than the first capacitive load during steady state if the peak voltage value is equal to or greater than the predetermined voltage value; and,
    a second controller coupled to the peak detector for comparing the peak voltage value against a second predetermined voltage value, and to change a gain of the amplifier when the peak voltage is dissimilar in absolute magnitude than the second predetermined value.

13. The oscillator as recited in claim 12, further comprising a varactor that includes a transistor with a mutually coupled source and drain region and a gate region coupled to receive a bias signal whose magnitude is dependent upon a comparison of the peak voltage value and the predetermined voltage value.

14. The oscillator as recited in claim 12, wherein the bias signal is a current applied to a node which forms a voltage upon the gate for placing the transistor in a depletion mode if the current is of a first current value and for placing the transistor in an inversion mode if the current is of a second current value greater than the first current value.

15. The oscillator as recited in claim 12, wherein the change of gain of the amplifier decreases if the peak voltage is greater in absolute magnitude than the second predetermined value.

16. The oscillator as recited in claim 15, wherein the first capacitive load is applied to the pair of nodes, followed by the second capacitive load applied to the nodes, followed by the decrease in gain of the amplifier.

17. A method for regulating an oscillator output, comprising:
    detecting a peak voltage output from the oscillator; comparing the peak voltage to a reference voltage;
    decreasing the capacitive loading on the oscillator if the peak voltage is less than the reference voltage during start up of the oscillator;
    optionally increasing the capacitive loading on the oscillator if the peak voltage is greater than the reference voltage subsequent to start up of the oscillator; and,
    changing amplifier gain when the peak voltage is dissimilar in absolute magnitude relative to another reference voltage.

18. The method as recited in claim 17, further comprising decreasing gain from the oscillator subsequent to said increasing.

* * * * *